United States Patent
Ishida

(10) Patent No.: US 11,890,791 B2
(45) Date of Patent: Feb. 6, 2024

(54) CONTROL METHOD, STORAGE MEDIUM, IMPRINT METHOD, AND ARTICLE MANUFACTURING METHOD

(71) Applicant: CANON KABUSHIKI KAISHA, Tokyo (JP)

(72) Inventor: Shingo Ishida, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 159 days.

(21) Appl. No.: 17/326,465

(22) Filed: May 21, 2021

(65) Prior Publication Data
US 2021/0370558 A1    Dec. 2, 2021

(30) Foreign Application Priority Data
Jun. 1, 2020 (JP) .................... 2020-095697

(51) Int. Cl.
| | |
|---|---|
| B29C 43/58 | (2006.01) |
| B29C 59/00 | (2006.01) |
| B29C 59/02 | (2006.01) |
| G03F 7/00 | (2006.01) |

(52) U.S. Cl.
CPC ............ B29C 43/58 (2013.01); B29C 59/002 (2013.01); *B29C 59/022* (2013.01); *B29C 2043/5875* (2013.01); *G03F 7/0002* (2013.01)

(58) Field of Classification Search
None
See application file for complete search history.

(56) References Cited

U.S. PATENT DOCUMENTS

| | | | |
|---|---|---|---|
| 8,556,616 B2 | 10/2013 | Resnick | |
| 2020/0004158 A1* | 1/2020 | Koga | .................. G03F 7/70625 |

FOREIGN PATENT DOCUMENTS

| | | | | |
|---|---|---|---|---|
| JP | 2009536591 A | | 10/2009 | |
| JP | 2020008841 A | * | 1/2020 | ........... G03F 7/0002 |
| JP | 2020043338 A | | 3/2020 | |
| WO | 2007132320 A2 | | 11/2007 | |

* cited by examiner

*Primary Examiner* — Robert J Grun
(74) *Attorney, Agent, or Firm* — ROSSI, KIMMS & McDOWELL LLP

(57) ABSTRACT

A method of controlling a control apparatus for controlling a forming apparatus operable to form a layer of a formable material on a substrate is provided. The method includes acquiring data that specifies a drop amount and a drop position on the substrate of each of droplets, calculating a spread of each of the droplets assuming that a spread shape of each of the droplets is a polygon, and calculating a surface area of an overlapping region in which a region of a droplet that spreads into the polygon and a region of a recessed portion in the mold to be filled with the formable material overlap, and correcting, based on a result of the calculation, the data so that the recessed portion is filled with the formable material.

10 Claims, 6 Drawing Sheets

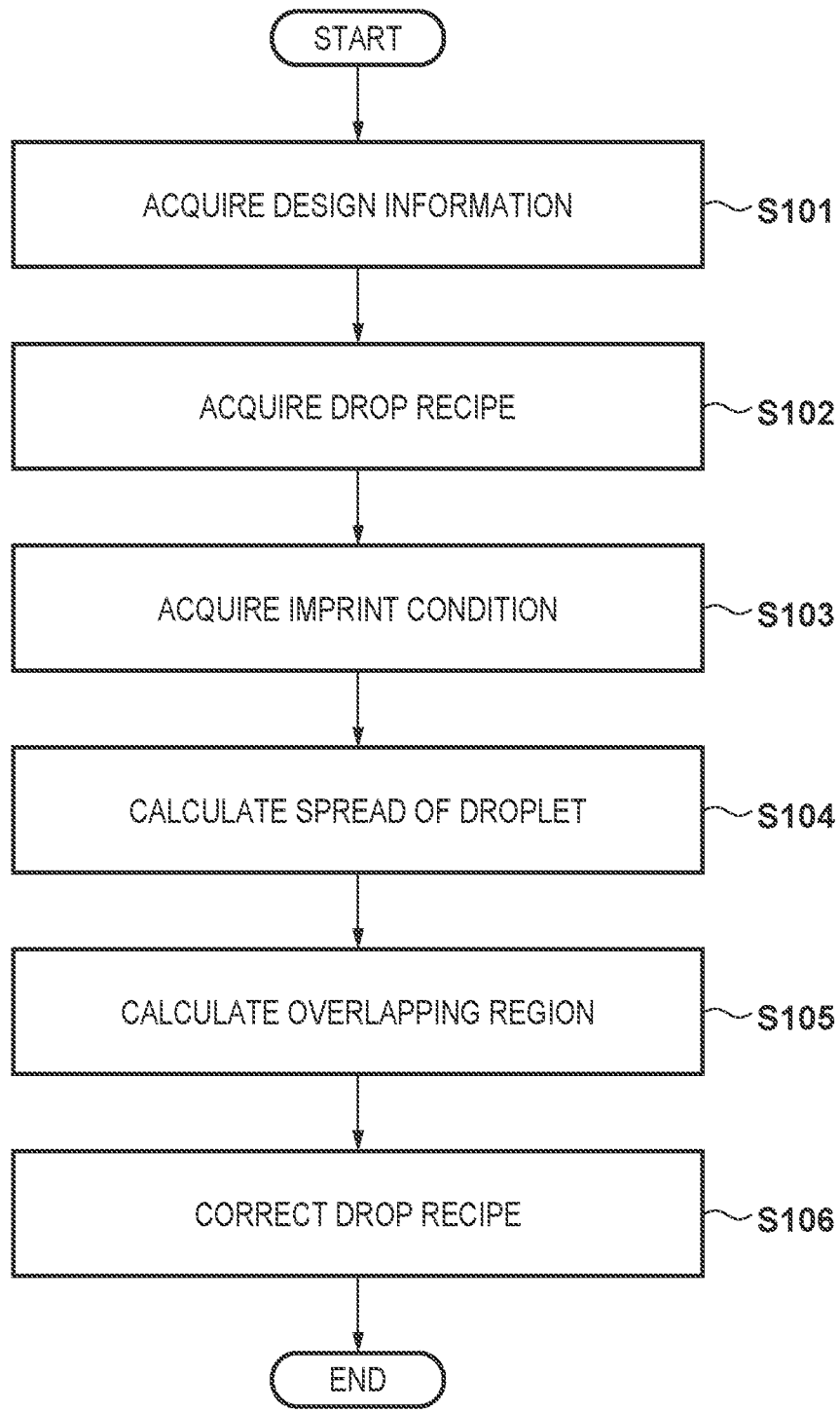

CONTROL METHOD, STORAGE MEDIUM, IMPRINT METHOD, AND ARTICLE MANUFACTURING METHOD

BACKGROUND OF THE INVENTION

Field of the Invention

The present invention relates to a control method, a storage medium, an imprint method, and an article manufacturing method.

Description of the Related Art

Forming apparatuses form a layer of formable material onto a substrate by supplying a plurality of droplets of formable material onto the substrate and then causing the plurality of droplets to merge by causing the plurality of droplets supplied onto the substrate and a mold to come into contact. As a typical example of a forming apparatus, there is an imprint apparatus, which uses an imprint technique. Imprint apparatuses cause an imprint material, which is a formable material on a substrate, to fill a recessed portion, which constitutes a pattern of a mold, by causing the imprint material and the mold to come into contact. The imprint material is then cured, causing the pattern of the mold to be transferred onto the substrate.

Japanese Patent Laid-Open No. 2009-536591 describes causing a mold to deform into a shape protruding toward a substrate and a central portion of the mold to make contact in relation to the imprint material on a substrate and then causing a contact region of an imprint material and a mold to increase. In the process of causing the contact area of the imprint material and the mold to increase, gas that exists between the imprint material and the mold is discharged from a central portion.

In Japanese Patent Laid-Open No. 2020-043338, a method of positioning droplets of an imprint material in which gas that exists between the imprint material and a mold is discharged at a high speed is disclosed.

In Japanese Patent Laid-Open No. 2020-043338, the positioning of the droplets of the imprint material is decided so as to discharge the gas that exists between the imprint material and the mold at a high-speed.

However, there are recessions and protrusions in the mold and the substrate, and there are recessed portions to be filled with the imprint material. In particular, the mold and the substrate are provided with marks for positioning, and there are recessed portions, which constitute the marks. Japanese Patent Laid-Open No. 2020-043338 does not consider reliably filling an imprint material into such recessed portions, and it may be the case that the imprint material does not fill the recessed portions. For example, if the portions of the marks for positioning are unfilled, overlaying, or the like, in the next step may be affected.

SUMMARY OF THE INVENTION

The present invention provides a technique that is advantageous for achieving both high-speed discharging of gas between a formable material on a substrate and a mold and prevention of portions being unfilled.

The present invention in its one aspect provides a method of controlling a control apparatus for controlling a forming apparatus operable to form a layer of a formable material on a substrate by supplying a plurality of droplets of the formable material onto the substrate and then causing the plurality of droplets to merge by causing the plurality of droplets supplied onto the substrate and a mold to come into contact. The method comprises acquiring data that specifies a drop amount and a drop position on the substrate of each of the plurality of droplets, calculating a spread of each of the plurality of droplets assuming that a spread shape of each of the plurality of droplets, for when the plurality of droplets are supplied onto the substrate in accordance with the data and then the plurality of droplets and the mold are caused to come into contact, is a polygon, and calculating a surface area of an overlapping region in which a region of a droplet that spreads into the polygon and a region of a recessed portion in the mold to be filled with the formable material overlap, and correcting, based on a result of the calculation, the data so that the recessed portion is filled by the formable material.

Further features of the present invention will become apparent from the following description of exemplary embodiments (with reference to the attached drawings).

BRIEF DESCRIPTION OF THE DRAWINGS

FIG. 2 is a flowchart of a method of controlling a control apparatus for correcting a drop recipe.

DESCRIPTION OF THE EMBODIMENTS

Figure 1:
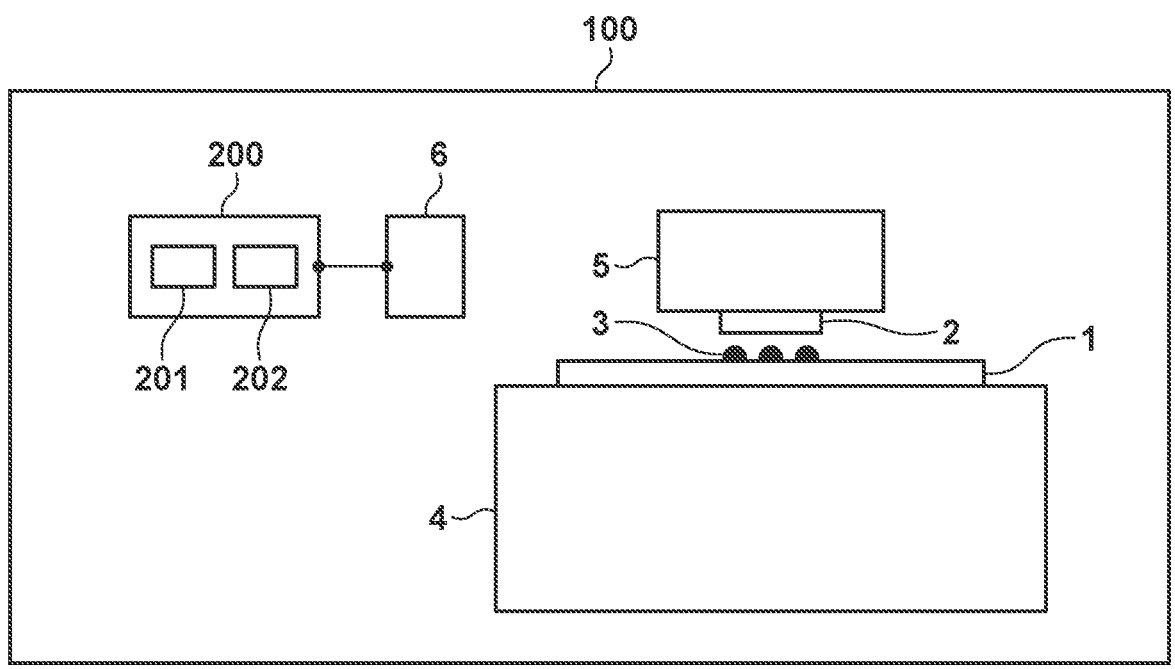
FIG. 1 is a view showing a configuration of an imprint apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

The present invention is related to a forming apparatus that performs forming processing for forming a curable composition (hereinafter, simply referred to as "composition"), which is a formable material, on a substrate. The forming processing may include a supply step for discretely supplying droplets of a composition onto a substrate and a contact step for causing the composition supplied onto the substrate and a mold (also called an original or a template) to come into contact. The forming processing further includes a curing step for curing the composition in a state in which the composition and the mold in contact and a separation step for separating the cured composition and the mold. In the present embodiment, an imprint apparatus, which is a specific example of a forming apparatus, will be described. FIG. 1 is a view illustrating a configuration of an imprint apparatus 100 in an embodiment.

First, an overview of the imprint apparatus according to the embodiment will be described. The imprint apparatus is an apparatus that forms a pattern of a cured resultant onto which a recessed/projecting pattern of a mold has been transferred by causing an imprint material, which is a formable material that was supplied onto a substrate, and a mold to come into contact and then applying energy for curing to the imprint material.

As an imprint material, a curable composition (sometimes called uncured resin), which is cured by application of energy for curing, is used. As the energy for curing, an electromagnetic wave, heat, or the like can be used. The electromagnetic wave can be, for example, light selected from the wavelength range of 10 nm (inclusive) to 1 mm (inclusive) and, more specifically, infrared light, a visible light beam, or ultraviolet light. The curable composition can be a composition cured by light irradiation or heating. A photo-curable composition cured by light irradiation contains at least a polymerizable compound and a photopolymerization initiator, and may further contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like. The imprint material may be arranged on the substrate in the form of droplets or in the form of an island or a film formed by connecting a plurality of droplets by a liquid injection head. The viscosity (the viscosity at 25° C.) of the imprint material can be, for example, 1 mPa·s (inclusive) to 100 mPa·s (inclusive). As the material of the substrate, for example, glass, a ceramic, a metal, a semiconductor, a resin, or the like can be used. A member made of a material different from the substrate may be provided on the surface of the substrate, as needed. The substrate includes, for example, a silicon wafer, a compound semiconductor wafer, or silica glass. Also, the substrate may be a glass substrate for manufacturing a replica mold from a master mold by imprint processing.

In the specification and the accompanying drawings, directions will be indicated by an XYZ coordinate system in which directions parallel to the surface of the substrate 1 are set as the X-Y plane. Directions parallel to the X-axis, the Y-axis, and the Z-axis of the XYZ coordinate system are the X direction, the Y direction, and the Z direction, respectively, and a rotation about the X-axis, a rotation about the Y-axis, and a rotation about the Z-axis are θX, θY, and θZ, respectively.

The imprint apparatus 100 of FIG. 1 employs a photo-curing method, which cures an imprint material by irradiating light. A mold holding unit 5 draws and holds a mold 2 using a vacuum suction force or an electrostatic force. The mold holding unit 5 causes the mold 2 to move in the Z direction so as to selectively cause an imprint material 3 on top of the substrate 1 and the mold 2 to come into contact, and to separate (release) the imprint material 3 on top of the substrate 1 and the mold 2. Also, the mold holding unit 5 may be configured to be able to move the mold 2 in not only the Z direction but also the X direction and the Y direction. Furthermore, the mold holding unit 5 may comprise a tilt mechanism for adjusting the position of the mold 2 in the θZ direction and the tilt of the mold 2 in relation to the X-Y plane.

A substrate stage 4 draws and holds the substrate 1 using a vacuum suction force or an electrostatic force. The substrate stage 4 is movable within the XY plane. When causing the mold 2 and the imprint material 3 on the substrate 1 to come into contact, the position of the substrate stage 4 is adjusted, and by this, the position of the mold 2 and the position of the substrate 1 are aligned with each other. Actuators applicable to the substrate stage 4 include, for example, a linear motor and an air cylinder. Also, the substrate stage 4 may be configured to be able to move the substrate 1 in not only the X direction and the Y direction but also the Z direction. Note that the contact and release of the imprint material 3 on the substrate 1 and the mold 2 may be realized by the mold holding unit 5 causing the mold 2 to move in the Z direction. However, the contact and release may be realized by the substrate stage 4 causing the substrate 1 to move in the Z direction. Alternatively, the contact and release may be realized by causing both the mold 2 and the substrate 1 to move relatively in the Z direction. Also, the substrate stage 4 may comprise a tilt mechanism for adjusting the position of the substrate 1 in the θZ direction and the tilt of the substrate 1 in relation to the X-Y plane.

A supply unit 6 is positioned in the vicinity of the mold holding unit 5 and supplies the imprint material 3 to at least one shot region (forming region) on the substrate 1. The supply unit 6 discretely supplies droplets of the imprint material onto the substrate by an inkjet method. The supply unit 6 has, for example, a piezo-type discharge mechanism (inkjet head), which includes a plurality of discharge ports. The amount of a droplet of the imprint material 3 can be adjusted in a range of 0.1 to 10 pL/droplet, and normally, it is often the case that approximately 1 pL/droplet is used. Note that the supply amount (drop amount) of the imprint material 3 is decided based on the density of a pattern of the mold and a desired residual layer thickness. The supply unit 6 dispersedly positions, on the shot region, the imprint material 3 as droplets in accordance with a supply pattern, which indicates the amount of a droplet and the drop position of each droplet generated by a control apparatus 200 to be described later.

The control apparatus 200 is configured by at least one computer (information processing apparatus), which includes a CPU 201 and a memory 202. Also, the control apparatus 200 is connected to each component of the imprint apparatus 100 via a line (regardless being wired/wireless) and controls the operation, adjustment, and the like of each component of the imprint apparatus 100 in accordance with a program stored in the memory 202. Also, data (drop recipe) of a supply pattern (which specifies the drop amount and drop position of each of a plurality of droplets onto the substrate) of the imprint material is stored in the memory 202 (or another storage medium) of the control apparatus 200. The supply unit 6 dispersedly positions the droplets of the imprint material 3 on the shot region in accordance with this drop recipe. Note that the control apparatus 200 may be configured integrally (in a common housing) with other parts of the imprint apparatus 100 or may be configured separately (in a separate housing) from other parts of the imprint apparatus 100.

Next, the imprint method (imprint processing) in the imprint apparatus 100 will be described. This imprint method is executed by the control apparatus 200. First, the substrate 1 is placed and then fixed onto the substrate stage 4. Next, the substrate stage 4 is driven, and the position of the substrate 1 is changed as appropriate. Then, a pattern is formed for each predetermined shot region (step and repeat). A flow of pattern formation related to a certain shot region is as follows. First, the substrate stage 4 is driven, and then the imprint material supply position (predetermined position on a shot region) on the substrate 1 is positioned below the supply port of the supply unit 6. Then, the imprint material is supplied onto the shot region by the supply unit 6 (supply step). For example, the supply unit 6 has a plurality of discharge ports, which are lined up in a sub-scanning direction (e.g., Y direction) at a certain interval, and discretely supplies droplets of the imprint material in a linear form onto the shot region. The control apparatus 200 can supply the imprint material onto the shot region in a region of a desired shape such as a rectangular shape by causing the substrate stage 4 (i.e., substrate 1) to move in the scanning direction (e.g., X direction) while supplying the imprint material.

Next, the substrate 1 is moved by the substrate stage 4 so that the shot region is positioned at the imprint position directly below the mold 2. Then, the mold holding unit 5 is driven, and then the imprint material 3 on the shot region and the mold 2 come into contact (contact step). At this time, the contact of the imprint material 3 and the mold 2 is started after the mold 2 has been deformed into a shape protruding toward the substrate 1. The shape of a contact surface of the mold 2 and the imprint material 3 is circular or of a similar shape and spreads from the center of the shot region outward while maintaining that shape. By this contact step, the imprint material 3 is filled into the recessed/projecting pattern of the mold 2. In this state, light from a light source (not shown) is irradiated onto the imprint material 3 via the mold holding unit 5 and the mold 2, and the imprint material is cured (curing step). After the imprint material 3 is cured, the mold holding unit 5 is driven, and the mold 2 and the imprint material 3 are separated (separation step). By this, a three-dimensional imprint material pattern (layer), which conforms to the recessed/projecting pattern of the mold 2, is formed on the surface of the shot region on the substrate 1. By conducting a plurality of rounds of such a sequence of imprint operations while changing the shot region by driving the substrate stage 4, the imprint apparatus 100 can form a pattern of the imprint material on each of a plurality of shot regions on the substrate 1.

When causing the imprint material 3 to fill the mold in the contact step, if air that exists between the mold 2 and the substrate 1 enters the mold 2, a defect where a portion remains unfilled may occur. Accordingly, it is preferable that gas, which has at least one of the properties of high solubility or high diffusibility, is supplied in relation to the imprint material 3 into the space between the mold 2 and the substrate 1.

In the process of increasing the contact region of the imprint material on the substrate and the mold, if gas is trapped in the space between the mold and the imprint material, filling of the imprint material into the recessed portion of the mold will be impeded. If the imprint material is cured in a state in which the filling of the imprint material into the recessed portion of the mold is incomplete, a defect may occur in the pattern formed by the cured resultant of the imprint material. Accordingly, it is necessary to wait to start curing the imprint material until the above gas, which was trapped in the space, is eliminated by being dissolved into the imprint material or by being condensed, and then to fill the imprint material into the recessed portion of the mold. Such a process may lower the throughput. Trapping of gas may be caused by a path from which the gas is discharged being blocked by the imprint material. For this reason, in Japanese Patent Laid-Open No. 2020-043338, the positioning of the droplets of the imprint material is decided so as to discharge the gas that exists between the imprint material and the mold at a high-speed.

However, in addition to normal fine patterning, marks for positioning are provided on molds. Also, there are recessions and protrusions on substrates. As Japanese Patent Laid-Open No. 2020-043338 does not consider information of a mark for positioning the mold or the recessions and protrusions of the substrate, there is the possibility that a portion will be unfilled due to the imprint material being insufficient at the mark for positioning the mold or at the recessed and protruding portions of the substrate. The present embodiment addresses such a problem.

The method of controlling the control apparatus 200 in the embodiment will be described in detail. FIG. 2 is a flowchart of a method of controlling the control apparatus 200 for correcting a drop recipe. The programs that correspond to this flowchart are stored in a memory 202 (or another storage medium) of the control apparatus 200 and are executed by the CPU 201.

In step S101, the control apparatus 200 acquires design information, which may include information of the recessions and protrusions and information of marks on the mold 2, information of the recessions and protrusions of the substrate 1, the specified residual layer thickness of the imprint material, and the like. The design information may be acquired by receiving from the outside via a network or the like or may be acquired by having the design information inputted via the operation unit (user interface) in the control apparatus 200.

In step S102, the control apparatus 200 acquires the drop recipe. The drop recipe may be acquired by receiving it from an external unit via a network or the like or by having the drop recipe generated in the control apparatus 200 based on the design information acquired in step S101. The drop recipe acquired here may specify the drop amount and drop position on the substrate of each of the plurality of droplets based on a predetermined reference by which the occurrence of gas trapped by the plurality of droplets is reduced. For example, by the method disclosed in Japanese Patent Laid-Open No. 2020-043338, a drop recipe, which specifies the position of droplets for discharging gas that exists between the substrate and the mold at a high speed, may be acquired. The drop recipe acquired here is an initial drop recipe.

In step S103, the control apparatus 200 acquires an imprint condition (imprint parameter). The imprint condition may include the movement speed and force of the mold holding unit 5 for when causing the mold 2 and the imprint material 3 to contact, the degree by which to deform the pattern portion of the mold 2 to protrude toward the substrate, and the like.

In step S104, the control apparatus 200 calculates the spread of each of the plurality of droplets. Here, the spread of each of the plurality of droplets is calculated assuming that the shape of the spread of each of the plurality of droplets, for when the plurality of droplets are supplied onto the substrate, based on the design information and the imprint condition, in accordance with the drop recipe and then the plurality of droplets and the mold are brought into contact, is a polygon.

In step S105, the control apparatus 200 calculates a surface area of an overlapping region, which is a region on which a region of droplets that spread into polygons and a region of a recessed portion (e.g., a recessed portion of a mark) to be filled with the imprint material overlap.

In step S106, the control apparatus 200 corrects the initial drop recipe so that the imprint material is caused to fill the above recessed portion based on the calculation result in step S105. Specifically, for example, the drop amount of droplets in the overlapping region is increased so that the imprint material is caused to fill the above recessed portion.

Figure 3A:
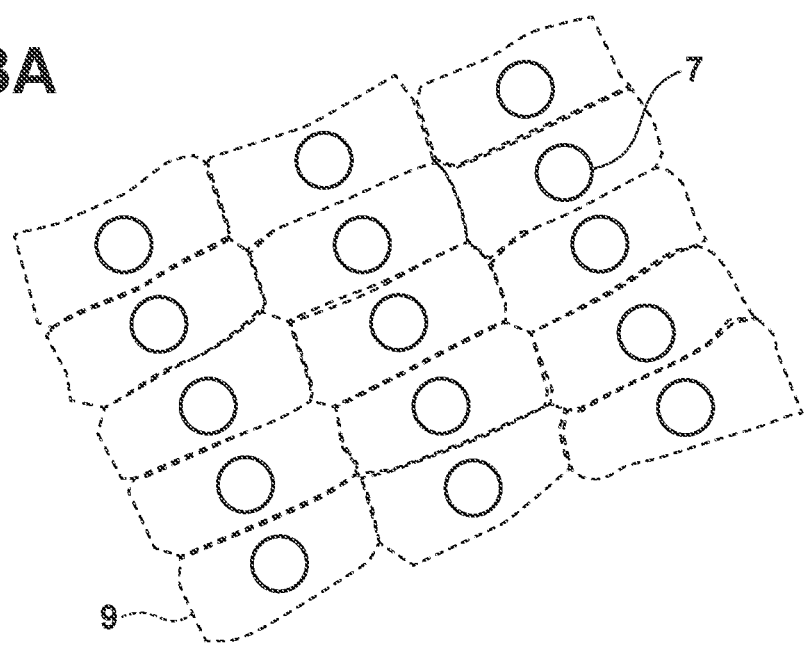
FIGS. 3A to 3C are views exemplifying shapes of spreading of each of a plurality of droplets.
Figure 3B:
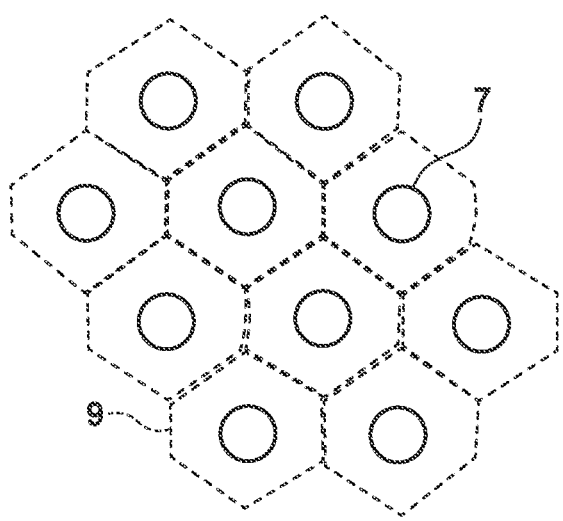
Figure 3C:
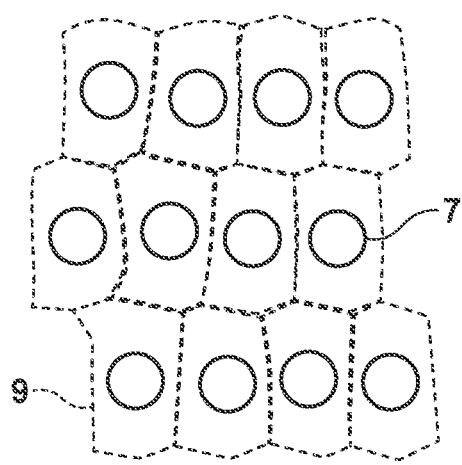

FIGS. 3A to 3C exemplify the shape of the spread of each of the plurality of droplets for when the plurality of droplets and the mold are brought into contact. The drop amount and drop position of a droplet in the drop recipe may generally be set based on the contact region of the imprint material on the substrate and the mold, the size of the recessed and protruding region of the mold, the specified residual layer thickness of the imprint material, and the like. Also, as described above, the initial drop recipe specifies the drop amount and drop position on the substrate of each of the plurality of droplets based on a predetermined reference by which the occurrence of gas trapped by the plurality of droplets is reduced. As illustrated in FIGS. 3A to 3C, the plurality of droplets may be positioned in a grid based on such a predetermined reference. In step S104, the spread of a droplet is calculated assuming that a spread shape 9 of droplets 7 positioned in a grid is a polygon. For example, in the example of FIG. 3A and FIG. 3C, the spread of a droplet is calculated assuming that the spread shape 9 of the droplets 7 is a four-sided shape (rectangle), and in the example of FIG. 3B, the spread of a droplet is calculated assuming that the spread shape 9 of the droplets 7 is a hexagon.

Figure 4A:
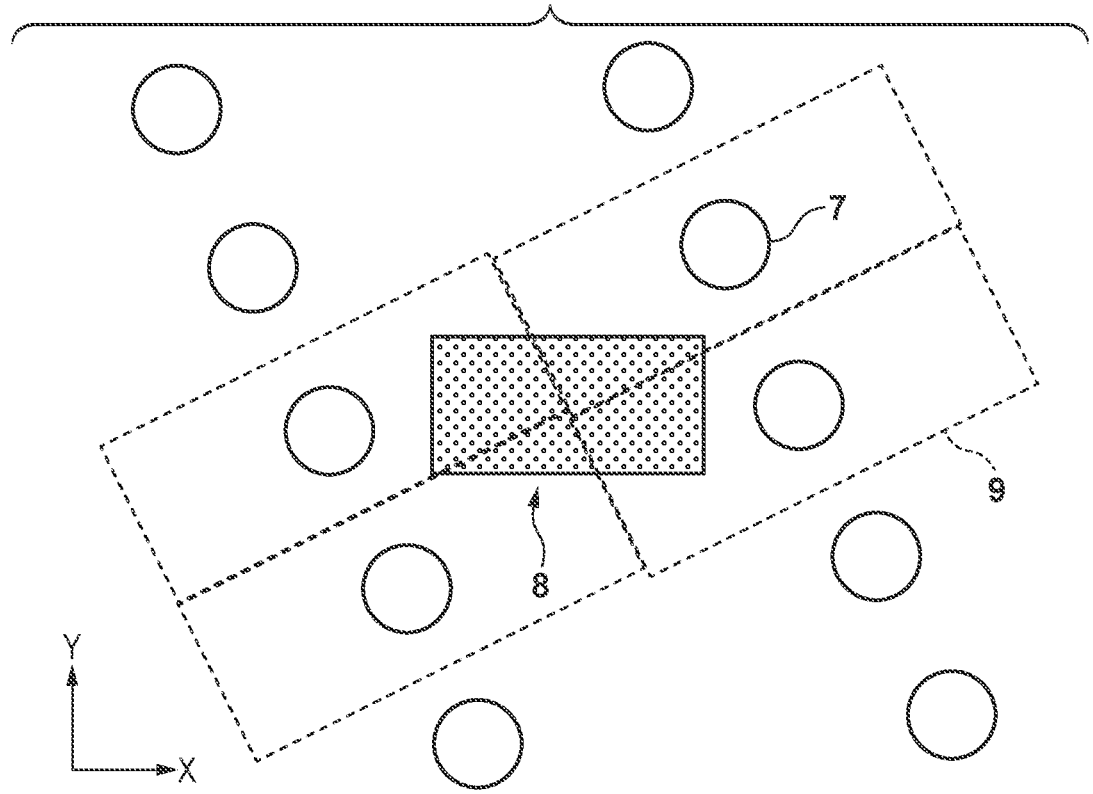
FIGS. 4A and B are views describing processing for calculating a surface area of overlapping regions.

Using the result of calculating the position and spread of the droplets illustrated in FIG. 3A as an example, steps S105 and S106 will be described in detail. In FIG. 4A, the droplets 7 positioned in accordance with the initial drop recipe and the spread shape 9 of the droplets 7 are illustrated. Here, the droplets 7 positioned as in FIG. 3A and the spread shape 9 thereof are illustrated. Also, in FIG. 4A, a recessed portion 8, which constitutes a mark formed in the mold that accords to the design information acquired in step S101, is displayed in an overlapping manner. The recessed portion 8 of the mark is an example of a recessed portion to be filled with the above imprint material. Under the assumption that the droplets 7 are positioned in a grid and the spread shape 9 of the droplets 7 is a rectangle, the surface area of an overlapping region, which is a region in which a region of the recessed portion 8 of the mark and a region of the spread droplets 7 overlap, is calculated.

Figure 4B:
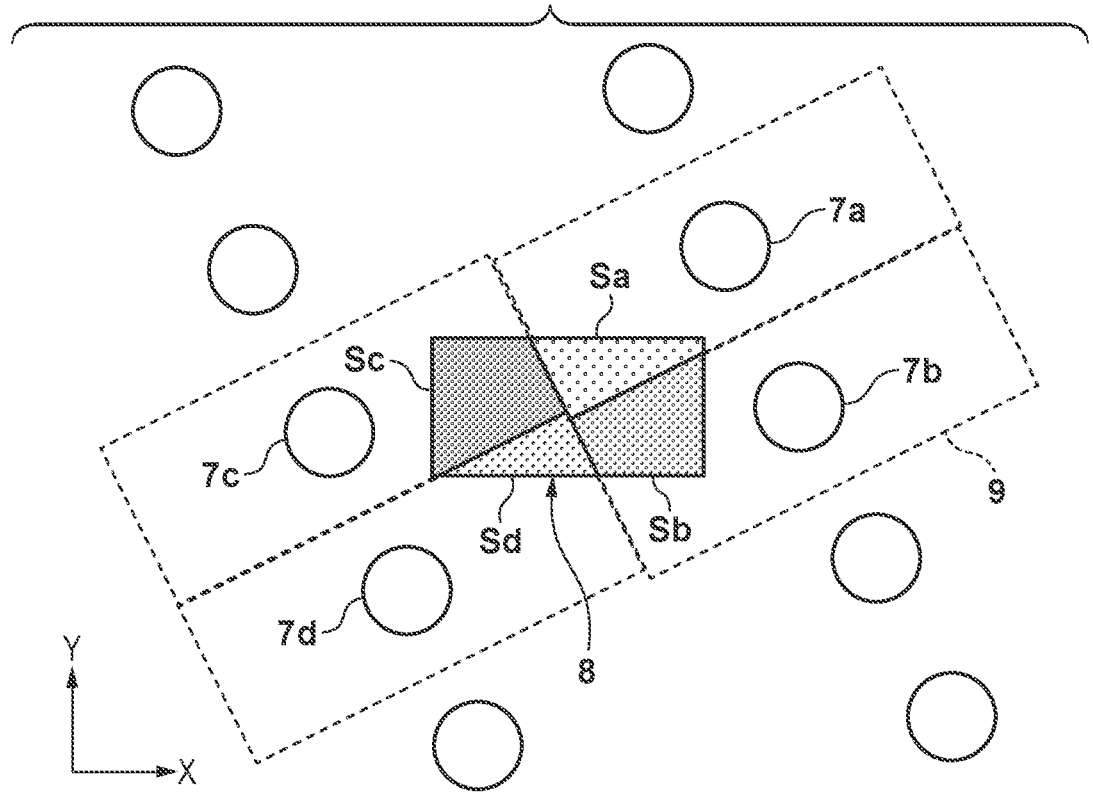

In FIG. 4B, a region Sa is an overlapping region of a region of a droplet 7a and a region of the recessed portion 8 of the mark. A region Sb is an overlapping region of a region of a droplet 7b and a region of the recessed portion 8 of the mark. A region Sc is an overlapping region of a region of a droplet 7c and a region of the recessed portion 8 of the mark. A region Sd is an overlapping region of a region of a droplet 7d and a region of the recessed portion 8 of the mark. Assuming that a surface area of the recessed portion 8 of the mark (a surface area seen from the Z direction) is S, the volume of the recessed portion 8 of the mark is V, and a surface area of the overlapping region is Si (i is a sign for identifying a specific overlapping region and may take on any one of a, b, c, and d), a volume Vi of each droplet, which is how much the imprint material is lacking for it to fill the recessed portion 8 of the mark, is expressed by the following expression.

$$Vi = V \cdot Si/S$$

By adding Vi to the amount of a droplet of the initial drop recipe, it is possible to correct the amount of a droplet so that the imprint material is caused to fill the recessed portion 8 of the mark of the mold. The number of droplets, which changes the amount of a droplet, may be changed in accordance with the number of droplets that overlap with the mark and the like due to spreading. Also, the height of recession/protrusion of a mark 8 where the imprint material ends up not filling the portion does not need to be fixed and there may be gradual differences in the height across a wide range.

Accordingly, in step S106, which is a correcting step, a value, which is a volume V of the recessed portion 8 of the mark multiplied by a ratio that the overlapping region Si covers in a region S of the recessed portion 8, is obtained as an insufficient amount of a droplet, and based on this insufficient amount, the drop amount of a droplet in the drop recipe is corrected.

By virtue of the present embodiment, it is possible to efficiently calculate the spread of droplets that are to be positioned and to correct the amount of a droplet so that the mark portion of the mold is not unfilled by the imprint material. By this, it becomes possible to reduce the number of cases where portions are unfilled while maintaining the position of the droplets at which the gas between the substrate and the mold is discharged at a high speed.

Second Embodiment

In the above first embodiment, the amount of a droplet is corrected focusing on filling in a recessed portion of a mark of a mold. In contrast to this, in the second embodiment, the amount of a droplet is corrected focusing on a recessed portion of a mark on a substrate-side and recessions/protrusions of the substrate.

Figure 5A:
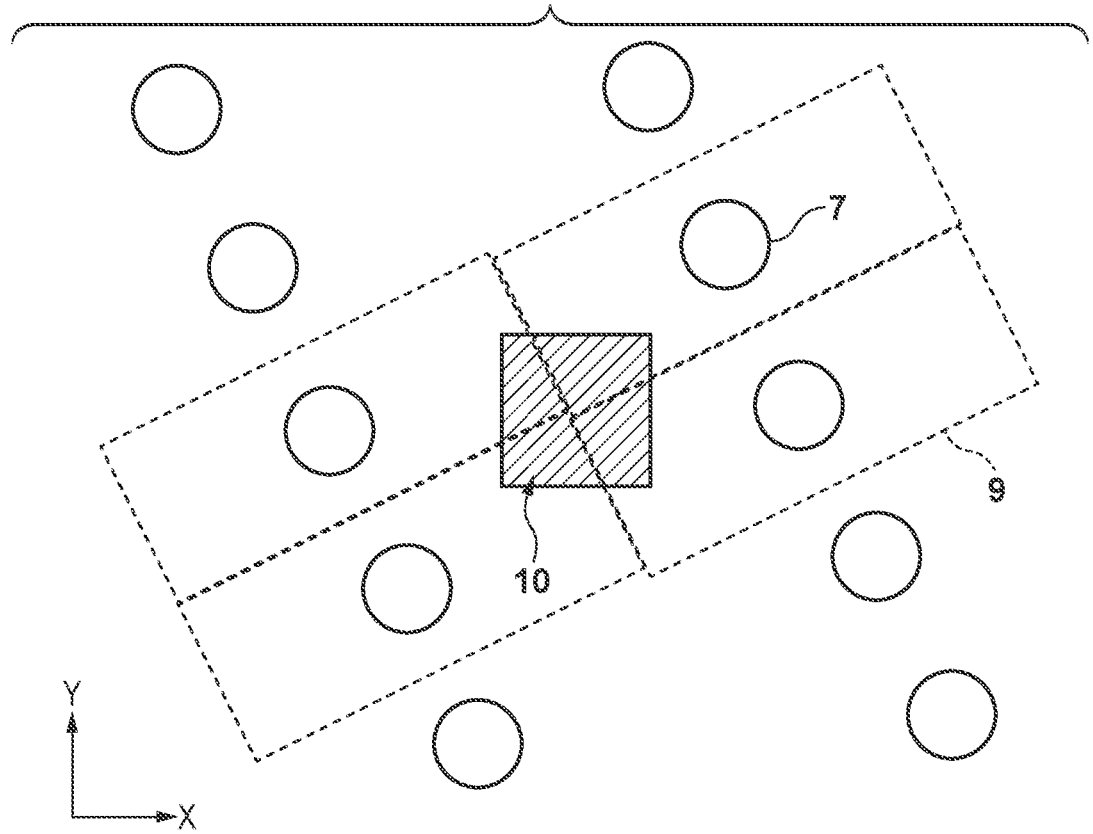
FIG. 5A and FIG. 5B are views describing processing for calculating a surface area of overlapping regions.

In FIG. 5A, the droplets 7 positioned in accordance with the initial drop recipe and the spread shape 9 of the droplets 7 are illustrated. Here, droplets 7 positioned as in FIG. 3A and the spread shape 9 thereof are illustrated. Also, in FIG. 5A, a recessed portion 10, which constitutes a mark formed in the substrate that accords to the design information acquired in step S101, is displayed in an overlapping manner. The recessed portion 10 of the mark is another example of a recessed portion to be filled with the above imprint material. Under the assumption that the droplets 7 are positioned in a grid and the spread shape 9 of the droplets 7 is a rectangle, the surface area of an overlapping region, where a region of the recessed portion 10 of the mark and a region of the spread droplets 7 overlap, is calculated.

In the present embodiment, the plurality of droplets are positioned so as to be radial from a shot center towards a shot edge. The plurality of droplets are positioned after having changed the linear density of the droplets of the imprint material in a direction that is orthogonal and in a direction that is parallel to the radial direction. Positioning the plurality of droplets after having changed the linear density thereof makes it possible to discharge the gas between the substrate and the mold at a high speed.

Figure 5B:
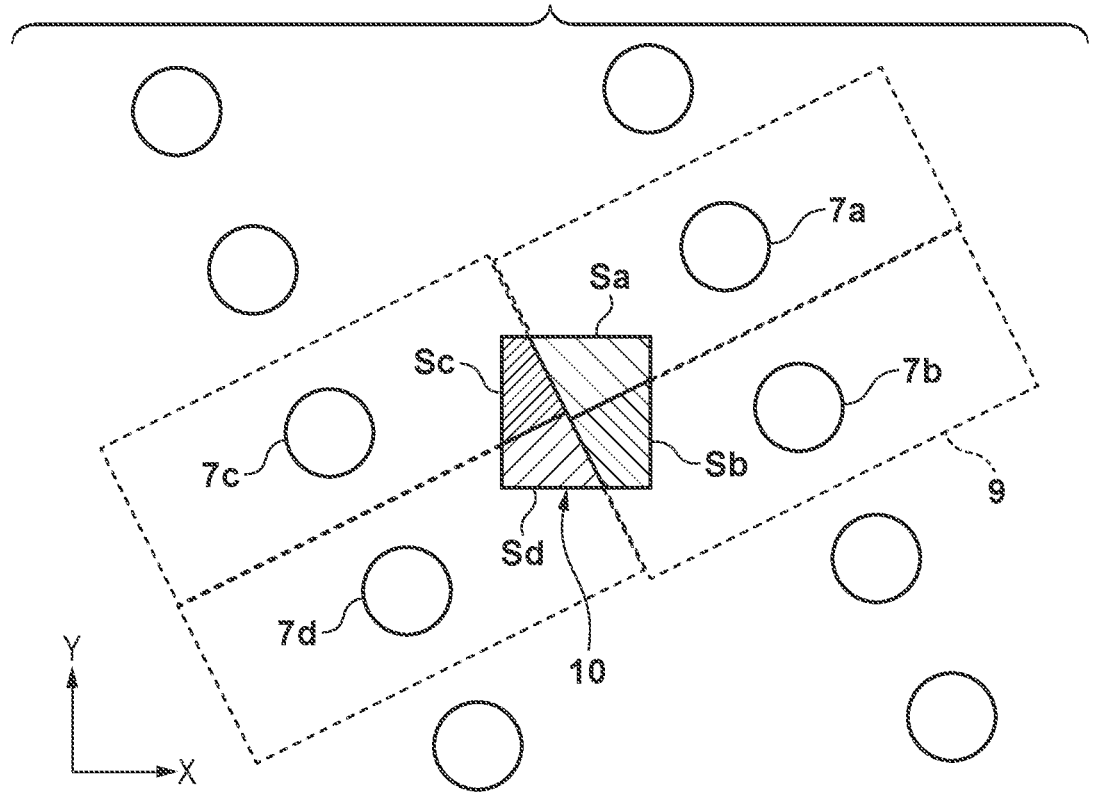

In FIG. 5B, a region Sa is an overlapping region of a region of the droplet 7a and a region of the recessed portion 10 of the mark. A region Sb is an overlapping region of a region of a droplet 7b and a region of the recessed portion 10 of the mark. A region Sc is an overlapping region of a region of a droplet 7c and a region of the recessed portion 10 of the mark. A region Sd is an overlapping region of a region of a droplet 7d and a region of the recessed portion 10 of the mark. Assuming that a surface area of the recessed portion 10 of the mark (a surface area as seen from the Z direction) is S, the volume of the recessed portion 10 of the mark is V, and a surface area of the overlapping region is Si (i identifies a specific overlapping region and may take on any one of a, b, c, and d), a volume Vi of each droplet, which is how much the imprint material is insufficient to fill the recessed portion 10 of the mark, is expressed by the following expression.

$$Vi = V \cdot Si/S$$

By adding Vi to the amount of a droplet of the initial drop recipe, it is possible to correct the amount of a droplet so that the imprint material is caused to fill the recessed portion 10 of the mark of the substrate. The number of droplets, which changes the amount of the droplets, may be changed in accordance with the number of droplets that overlap with the mark and the like due to spreading. Also, the height of recession/protrusion of a mark 10 where the imprint material ends up not filling the portion does not need to be fixed and there may be gradual differences in the height across a wide range.

Accordingly, in step S106, which is a correcting step, a value, which is a volume V of the recessed portion 10 of the mark multiplied by a ratio that the overlapping region Si covers in a region S of the recessed portion 10, is obtained as an insufficient amount of a droplet, and based on this insufficient amount, the drop amount of a droplet in the drop recipe is corrected.

By virtue of the present embodiment, it is possible to efficiently calculate the spread of droplets that are to be positioned and to correct the amount of a droplet so that the mark portion of the substrate is not unfilled by the imprint material. By this, it becomes possible to reduce cases where portions are left unfilled while maintaining the position of the droplets at which the gas between the substrate and the mold is discharged at a high speed.

Third Embodiment

In step S106 of the correcting step, in a case where the corrected drop amount of a droplet exceeds an upper limit or falls below a lower limit (i.e., in a case where it is not within a predetermined range) or in a case where the amount of correction of a droplet exceeds the resolution capability, not only the drop amount of a droplet but also the drop position of a droplet may be corrected.

Accordingly, by correcting the position of a droplet in addition to the amount of a droplet within the range of the position of a droplet at which the gas between the substrate and the mold is discharged at a high speed, it becomes possible to further reduce cases where portions are left unfilled related to the difference in the height of the substrate and the mold.

Fourth Embodiment

In accordance with a corrected drop recipe acquired by any one of the above embodiments, an imprint method may be conducted using the imprint apparatus of FIG. 1.

In the supply step, the plurality of droplets of the imprint material are supplied onto the substrate in accordance with the corrected drop recipe acquired by any one of the above embodiments.

In the contact step, the imprint material supplied onto the substrate and the mold are brought into contact. By this, each droplet is spread and the plurality of droplets are merged, forming a layer of the imprint material on the substrate.

In the curing step, the imprint material is cured in a state in which the imprint material and the mold are in contact.

In the separation step, the cured imprint material and the mold are separated.

<Embodiment of Article Manufacturing Method>

A pattern of a cured material formed by using an imprint apparatus is used permanently for at least some of various articles, or is used temporarily when manufacturing various articles. The articles include an electric circuit element, an optical element, a MEMS, a recording element, a sensor, and a mold. Examples of the electric circuit element are a volatile or nonvolatile semiconductor memory such as a DRAM, an SRAM, a flash memory, or an MRAM and a semiconductor element such as an LSI, a CCD, an image sensor, or an FPGA. An example of the mold is an imprinting mold.

The pattern of a cured material is used unchanged as a constituent member for at least some of the foregoing articles, or is temporarily used as a resist mask. The resist mask is removed after etching, ion implantation, or the like is performed in a substrate processing step.

Next, the article manufacturing method will be described. In step SA of FIG. 6, a substrate 1z which is a silicon substrate or the like on whose surface a processing target material 2z such as an insulator is formed is prepared, and next, an imprint material 3z is applied to the surface of the processing target material 2z by an ink-jet method. A state in which the imprint material 3z in the form of a plurality of droplets is applied onto the substrate is shown here.

Figure 6:
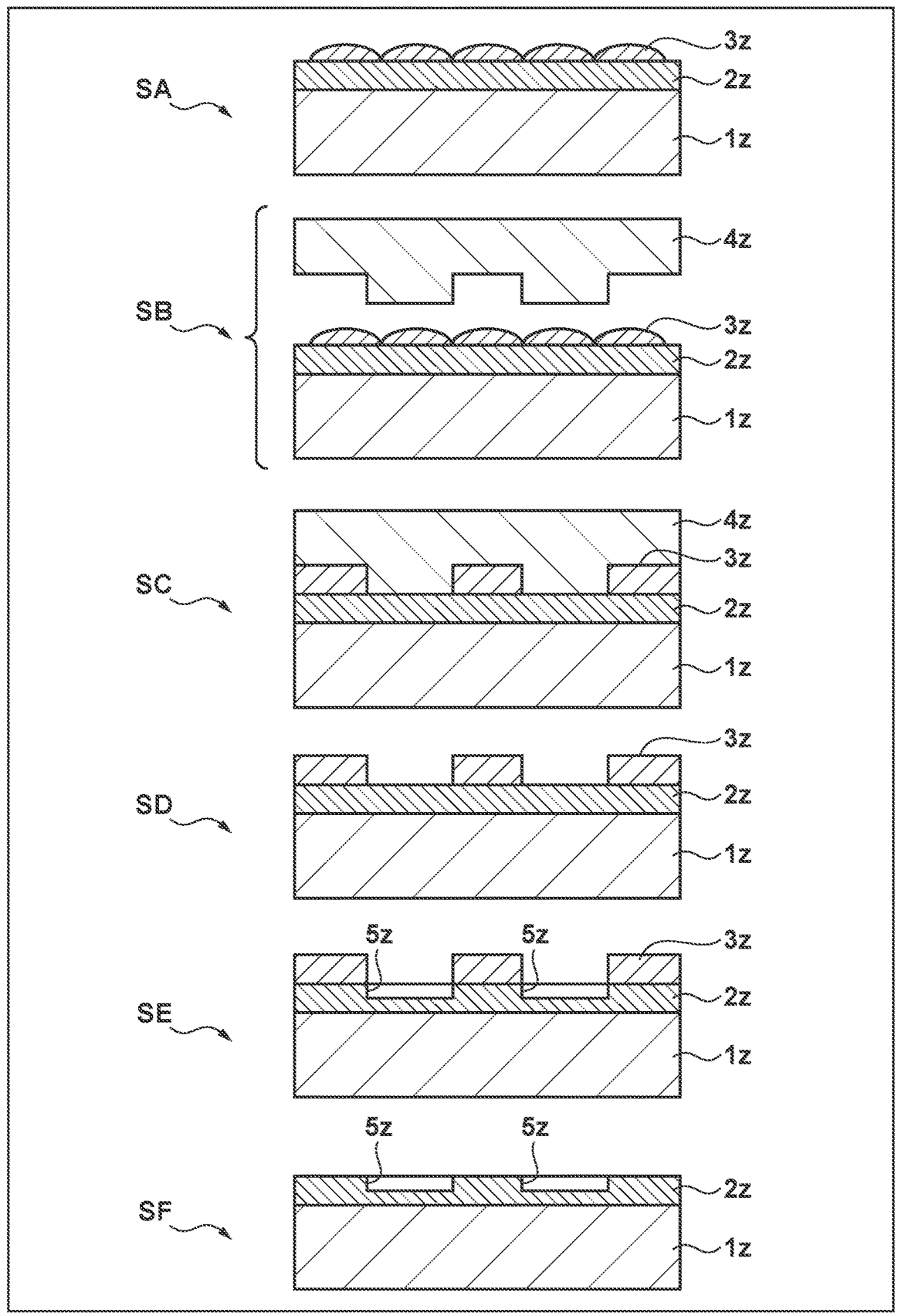
FIG. 6 is a view describing a method of manufacturing an article according to the embodiment.

As shown in step SB of FIG. 6, a side of an imprinting mold 4z on which its three-dimensional pattern is formed faces the imprint material 3z on the substrate. In step SC of FIG. 6, the substrate 1z to which the imprint material 3z has been applied and the mold 4z are brought into contact, and pressure is applied. Gaps between the mold 4z and the processing target material 2z is filled with the imprint material 3z. When the imprint material 3z is irradiated with light as curing energy through the mold 4z in this state, the imprint material 3z is cured.

In step SD of FIG. 6, when the mold 4z and the substrate 1z are separated after the imprint material 3z is cured, a pattern of the cured material of the imprint material 3z is formed on the substrate 1z. The pattern of this cured product has a shape such that the concave portion of the mold corresponds to the convex portion of the cured product, and the convex portion of the mold corresponds to the concave portion of the cured product; that is, the three-dimensional pattern of the mold 4z is transferred to the imprint material 3z.

In step SE of FIG. 6, when the pattern of the cured material is etched as an etching resistant mask, portions out of the surface of the processing target material 2z where the cured material is not present or thinly remains are removed, and grooves 5z are achieved. In step SF of FIG. 6, when the pattern of the cured material is removed, it is possible to achieve an article in which the grooves 5z are formed on the surface of the processing target material 2z. The pattern of the cured product is removed here; however, the pattern of the cured product may be used as, for example, an interlayer dielectric film included in the semiconductor element or the like, that is, the constituent member of the article without removing it after processing.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-095697, filed Jun. 1, 2020, which is hereby incorporated by reference herein in its entirety.

What is claimed is:

1. A method of controlling a control apparatus for controlling a forming apparatus operable to form a layer of a formable material on a substrate by supplying a plurality of droplets of the formable material onto the substrate and then causing the plurality of droplets to merge by causing the plurality of droplets supplied onto the substrate and a mold to come into contact, the method comprising:
    acquiring data that specifies a drop amount and a drop position on the substrate of each of the plurality of droplets;
    calculating a spread of each of the plurality of droplets assuming that a spread shape of each of the plurality of droplets, for when the plurality of droplets are supplied onto the substrate in accordance with the data and then the plurality of droplets and the mold are caused to come into contact, is a polygon, and calculating a surface area of an overlapping region in which a region of a droplet that spreads into the polygon and a region of a recessed portion in the mold to be filled with the formable material overlap; and
    correcting, based on a result of the calculation, the data so that the recessed portion is filled by the formable material.

2. The control method according to claim 1, wherein the data acquired in the acquisition specifies the drop amount and the drop position on the substrate of each of the plurality of droplets based on a predetermined reference at which occurrence of gas trapped by the plurality of droplets is to be reduced.

3. The control method according to claim 2, wherein the data acquired in the acquisition specifies the drop position so that the plurality of droplets are positioned in a grid based on the predetermined reference.

4. The control method according to claim 1, wherein the recessed portion is a recessed portion of a mark formed in the mold.

5. The control method according to claim 1, wherein the correction obtains a value, which is a volume of the recessed portion multiplied by a ratio that the overlapping region covers a region of the recessed portion, as an insufficient amount of a droplet and then corrects the drop amount of the droplet in the data based on the insufficient amount.

6. The control method according to claim 5, wherein the correction, in a case where the corrected drop amount of the droplet is not within a predetermined range, corrects the drop position of the droplet.

7. A method of controlling a control apparatus for controlling a forming apparatus operable to form a layer of a formable material on a substrate by supplying a plurality of droplets of the formable material onto the substrate and then causing the plurality of droplets to merge by causing the plurality of droplets supplied onto the substrate and a mold to come into contact, the method comprising:
    acquiring data that specifies a drop amount and a drop position on the substrate of each of the plurality of droplets;
    calculating a spread of each of the plurality of droplets assuming that a spread shape of each of the plurality of droplets, for when the plurality of droplets are supplied onto the substrate in accordance with the data and then the plurality of droplets and the mold are caused to come into contact, is a polygon, and calculating a surface area of an overlapping region in which a region of a droplet that spreads into the polygon and a region of a recessed portion in the substrate to be filled with the formable material overlap; and
    correcting, based on a result of the calculation, the data so that the formable material fills the recessed portion.

8. A non-transitory computer-readable storage medium configured to store a program for causing a computer to execute each process in the control method according to claim 1.

9. An imprint method comprising:
    supplying a plurality of droplets of an imprint material that is a formable material on a substrate in accordance with data acquired by the control method according to claim 1;
    causing the imprint material supplied onto the substrate and a mold to come into contact;
    curing the imprint material in a state in which the imprint material and the mold are in contact; and
    separating the cured imprint material and the mold.

10. An article manufacturing method comprising:
    forming a pattern on the substrate in accordance with the imprint method according to claim 9; and
    processing the substrate onto which the pattern has been formed,
    wherein an article is manufactured from the processed substrate.

* * * * *